US011798919B2

(12) United States Patent
Mai et al.

(10) Patent No.: US 11,798,919 B2
(45) Date of Patent: Oct. 24, 2023

(54) TRANSFER CARRIER AND MANUFACTURING METHOD THEREOF, AND METHOD FOR TRANSFERRING LIGHT-EMITTING DIODE CHIP

(71) Applicant: BOE Technology Group Co., Ltd., Beijing (CN)

(72) Inventors: Hsuanwei Mai, Beijing (CN); Zhanfeng Cao, Beijing (CN); Ke Wang, Beijing (CN); Haixu Li, Beijing (CN); Zhiwei Liang, Beijing (CN); Zhijun Lv, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 515 days.

(21) Appl. No.: 16/984,511

(22) Filed: Aug. 4, 2020

(65) Prior Publication Data
US 2021/0074689 A1 Mar. 11, 2021

(30) Foreign Application Priority Data

Sep. 11, 2019 (CN) .......................... 201910858485.0

(51) Int. Cl.
*H01L 33/00* (2010.01)
*H01L 25/075* (2006.01)

(52) U.S. Cl.
CPC ...... *H01L 25/0753* (2013.01); *H01L 33/0095* (2013.01)

(58) Field of Classification Search
None
See application file for complete search history.

(56) References Cited

U.S. PATENT DOCUMENTS

| 5,447,264 A * | 9/1995 | Koopman ............ H01L 21/6835 |
| | | 228/56.3 |
| 9,958,974 B2 * | 5/2018 | Xu ........................ G06F 3/0412 |
| 2002/0055237 A1 | 5/2002 | Sayyah |
| 2005/0155699 A1 | 7/2005 | Hayashi et al. |
| 2020/0227302 A1 | 7/2020 | Wu et al. |
| 2022/0051908 A1 * | 2/2022 | Hu ......................... H01L 24/20 |

FOREIGN PATENT DOCUMENTS

| CN | 108231653 A | 6/2016 |
| CN | 107818931 A | 3/2018 |
| CN | 207116403 A | 3/2018 |
| CN | 108010994 A | 5/2018 |
| WO | 02084631 A1 | 10/2002 |

OTHER PUBLICATIONS

Office Action for corresponding Chinese Application No. 201910858485.0 dated Apr. 7, 2021.

* cited by examiner

*Primary Examiner* — Bradley Smith
(74) *Attorney, Agent, or Firm* — ArentFox Schiff LLP; Michael Fainberg

(57) ABSTRACT

Disclosed are a transfer carrier and a manufacturing method thereof, and a method for transferring a light-emitting diode chip. The transfer carrier includes: a substrate having a plurality of via holes penetrating a thickness of the substrate, the substrate having a first surface and second surface which are opposite to each other; and thermoplastic structures filling corresponding ones of the via holes, one end of the thermoplastic structures protruding from the second surface of the substrate, and the other end covering a surrounding area on the first surface, of the corresponding via holes.

10 Claims, 7 Drawing Sheets

TRANSFER CARRIER AND MANUFACTURING METHOD THEREOF, AND METHOD FOR TRANSFERRING LIGHT-EMITTING DIODE CHIP

CROSS-REFERENCE TO RELATED APPLICATION

This application claims priority of Chinese Patent Application No. 201910858485.0, filed on Sep. 11, 2019, which is hereby incorporated by reference in its entirety.

FIELD

The present disclosure relates to the technical field of display, and in particular to a transfer carrier and a manufacturing method thereof, and a method for transferring a light-emitting diode chip.

BACKGROUND

A mini/micro light-emitting diode (LED) is drawing attention of more and more people in the field of display due to its excellent characteristics such as self-illumination, a high luminous efficiency, a high contrast, a wide range of operating temperature, a long service life, a low power consumption and a very fast response.

Due to advantages of a mini/micro light-emitting diode (Mini LED/Micro LED) chip such as self-illumination, a simple structure, a small size and energy saving, the display technology of the Mini LED/Micro LED will become a revolutionary technology of the next generation.

SUMMARY

According to a first aspect, an embodiment of the present disclosure provides a transfer carrier, including:

a substrate having a plurality of via holes penetrating the substrate in a thickness direction of the substrate, the substrate having a first surface and a second surface, wherein the first surface and the second surface are opposite to each other; and a plurality of thermoplastic structures configured to fill the via holes, wherein one end of the thermoplastic structures protrudes from the second surface, and the other end of the thermoplastic structures covers a surrounding area on the first surface, of corresponding via holes.

In some embodiments, parts of the thermoplastic structures are connected to each other as an integrated structure, wherein the parts cover the first surface.

In some embodiments, a heat conductivity coefficient of the substrate is greater than a heat conductivity coefficient of the thermoplastic structures.

In some embodiments, a material of the substrate is metal or ceramic.

In some embodiments, the transfer carrier further includes a plurality of heating wires between the first surface of the substrate and the thermoplastic structures; wherein, the heating wires are uniformly distributed in an area of the substrate excluding the via holes.

In some embodiments, the transfer carrier further includes a plurality of heating wires between the second surface of the substrate and the thermoplastic structures; wherein, the heating wires are uniformly distributed in an area of the substrate excluding the via holes.

In some embodiments, a material of the thermoplastic structures is wax, rubber, or silica gel.

In some embodiments, the transfer carrier further includes a plurality of light-emitting diode chips, wherein the light-emitting diode chips correspond to the thermoplastic structures in a one-to-one manner, and are embedded in corresponding thermoplastic structures respectively.

According to a second aspect, an embodiment of the present disclosure further provides a transfer method of a light-emitting diode chip, including:

providing a substrate having a plurality of light-emitting diode chips, and a driving backboard having a plurality of driving electrodes, wherein the light-emitting diode chips are on a surface of the substrate;

aligning a second surface of the transfer carrier according to claim 1 with the surface of the substrate, and contacting the thermoplastic structures with the light-emitting diode chips corresponding to the thermoplastic structures in an one-to-one manner;

heating the light-emitting diode chips to embed the light-emitting diode chips into corresponding thermoplastic structures, and cooling the light-emitting diode chips and the corresponding thermoplastic structures to enable the thermoplastic structures to absorb the light-emitting diode chips;

removing the transfer carrier to separate the light-emitting diode chips absorbed by the transfer carrier from the substrate;

aligning and attaching the surface of the transfer carrier with a surface of the driving backboard, wherein the surface of the driving backboard are provided with the driving electrodes; and heating the thermoplastic structures to release the light-emitting diode chips after softening the thermoplastic structures, and removing the transfer carrier.

In some embodiments, the heating the light-emitting diode chips to embed the light-emitting diode chips into the corresponding thermoplastic structures includes:

heating the substrate having the light-emitting diode chips on the surface.

In some embodiments, the light-emitting diode chips contact with the corresponding driving electrodes by a welding material; and the heating the thermoplastic structures to release the light-emitting diode chips after softening the thermoplastic structures includes:

heating the driving backboard to fix the light-emitting diode chips and the corresponding driving electrodes, and releasing the light-emitting diode chips from the thermoplastic structures after softening the thermoplastic structures.

According to a third aspect, an embodiment of the present disclosure further provides a manufacturing method of the transfer carrier, including:

providing a substrate;

forming a plurality of via holes penetrating the substrate;

forming a thermoplastic film layer on a first surface of the substrate;

heating the thermoplastic film layer and extruding the thermoplastic film layer after softening the thermoplastic film layer to make parts of the thermoplastic film layer fill the via holes and overflow out of a second surface of the substrate; and cooling the thermoplastic film layer to form thermoplastic structures.

In some embodiments, the extruding the thermoplastic film layer includes:

applying a pressure to a side far away from the substrate, of the thermoplastic film layer, or applying a pressure to a side far away from the thermoplastic film layer, of the substrate.

In some embodiments, the extruding the thermoplastic film layer includes:

applying a pressure to a side far away from the substrate, of the thermoplastic film layer, a side far away from the thermoplastic film layer, of the substrate.

DETAILED DESCRIPTION OF THE EMBODIMENTS

Embodiments of the present disclosure provide a transfer carrier and a manufacturing method thereof, and a method for transferring a light-emitting diode chip to solve problems on transfer of the light-emitting diode chip existing in the related art such as a high cost, a low efficiency, and difficulty in size enlargement.

A transfer carrier and a manufacturing method thereof, and a method for transferring a light-emitting diode chip provided by embodiments of the present disclosure will be depicted in detail with reference to the drawings. The thickness and shapes of film layers in the figures do not reflect actual scale, but only serve as schematic illustrations of the disclosure of the present disclosure.

Figure 1:
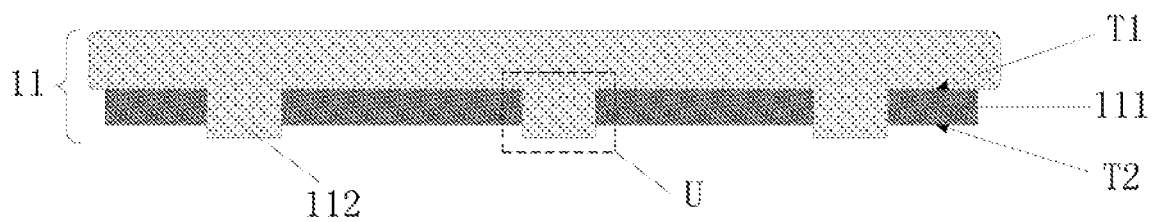
FIG. 1 is a first schematic diagram of a structure of a transfer carrier according to an embodiment of the present disclosure.

According to a first aspect, an embodiment of the present disclosure provides a transfer carrier. As shown in FIG. 1, the transfer carrier 11 includes:

a substrate 111 having a plurality of via holes U penetrating the substrate 111 in a thickness direction, the substrate 111 having a first surface T1 and second surface T2, the first surface T1 and the second surface T2 are opposite to each other; and a plurality of thermoplastic structures 112 configured to fill corresponding via holes U, one end of the thermoplastic structures 112 protruding from the second surface T2 of the substrate 111, and the other end covering a surrounding area on the first surface T1, of the corresponding via holes U.

The transfer carrier provided by an embodiment of the present disclosure can achieve transfer of light-emitting diode chips by providing a plurality of via holes penetrating the substrate and a plurality of thermoplastic structures. The transfer carrier has a simple structure and size enlargement can be easily realized, and besides, material costs are low. During transfer process of the light-emitting diode chips, the heated light-emitting diode chips can be embedded into the thermoplastic structures, and after cooling, the thermoplastic structures are enabled to absorb the light-emitting diode chips. The transfer process can be conducted easily at a low cost with a high transfer efficiency.

The transfer carrier 11 in some embodiments of the present disclosure includes a plurality of via holes U, and distribution of the plurality of via holes U may be set according to distribution of the light-emitting diode chips to be transferred. Moreover, in order to enable the thermoplastic structures 112 to absorb the light-emitting diode chips, the size of the via holes U may be set greater than the size of the light-emitting diode chips. In some embodiments, the plurality of thermoplastic structures 112 may be set to correspond to the plurality of via holes U in an one-to-one manner, or the number of the via holes U may be set greater than the number of the thermoplastic structures 112. Correspondence of the via holes and the thermoplastic structures is not limited herein.

In the actual process, after forming light-emitting diode chips on a wafer, the light-emitting diode chips on the wafer will be transferred to a substrate. If the number of the light-emitting diode chips on the substrate is small and there is certain spacing between adjacent light-emitting diode chips, the plurality of via holes U in the transfer carrier 11 may be set to be in one-to-one correspondence with the plurality of light-emitting diode chips on the substrate. In other words, the spacing between adjacent via holes U is substantially the same as the spacing between adjacent light-emitting diode chips, so that the light-emitting diode chips may be transferred with one transfer process.

If there are too many light-emitting diode chips on the substrate and the adjacent light-emitting diode chips are very close to each other, the spacing between adjacent via holes U may be set as an integer multiple of the size of the light-emitting diode chips (ignoring the spacing between adjacent light-emitting diode chips). For example, if the size of the light-emitting diode chips is about 50 μm×100 μm, the spacing between adjacent via holes U may be set to be 300 μm, so that one is absorbed every six light-emitting diode chips laterally distributed and one is absorbed every three light-emitting diode chips longitudinally distributed, thereby achieving the effect of selectively picking up light-emitting diode chips. After multiple transfers, transfer of the light-emitting diode chips on the substrate may be realized. This is only an example for illustrative purposes, and in specific implementation, distribution of via holes in the transfer carrier may be set according to the actual distribution of the light-emitting diode chips on the substrate, and is not limited herein.

In the transfer carrier provided by an embodiment of the present disclosure, by providing one of the thermoplastic structures 112 at the position of each of the via holes U, the thermoplastic structures 112 fill the corresponding ones of the via holes U. Moreover, one end of the thermoplastic structures 112 protrudes from the second surface T2 of the substrate 111, and the thermoplastic structures 112 are likely to melt or soften after being heated and may be solidified after being cooled.

In the actual process, after one end of the thermoplastic structures 112 protruding from the second surface T2 contacts with the light-emitting diode chips, the end of the thermoplastic structures 112 protruding from the second surface T2 may be softened by heating the light-emitting diode chips so that the light-emitting diode chips are embedded into the thermoplastic structures 112, then cooling is performed to make the thermoplastic structures 112 solidified to absorb the light-emitting diode chips. Meanwhile, due to the thermal expansion and contraction effect, a negative pressure is formed in the space into which the light-emitting diode chips are embedded, so that the light-emitting diode chips are firmly embedded into the thermoplastic structures 112, thereby achieving a selective pick-up of the light-emitting diode chips.

The other end of the thermoplastic structures 112 covers the surrounding area on the first surface T1, of corresponding ones of the via holes U, so as to ensure that the thermoplastic structures 112 will not leave from the via holes U due to the thermal expansion and contraction effect after experiencing heating, cooling and the like. Thus the thermoplastic structures 112 may be firmly fixed to the substrate 111 to ensure that the transfer carrier 11 may carry the plurality of light-emitting diode chips to move by the plurality of thermoplastic structures 112 during the subsequent transfer process.

Optionally, in the transfer carrier provided by an embodiment of the present disclosure, as shown in FIG. 1, parts of the thermoplastic structures 112 covering the first surface T1 are connected to each other as an integrated structure. In this way, firmness of the thermoplastic structures 112 may be further improved. Moreover, in the actual manufacturing process, a thermoplastic film layer may be directly formed on the first surface of the substrate 111, and the thermoplastic film layer is heated and extruded after being softened, so that part of the thermoplastic film layer fills the via holes and overflows out of the second surface T2 of the substrate 111 and then is cooled and solidified to obtain a plurality of thermoplastic structures. Therefore, a plurality of thermoplastic structures may be formed with one manufacturing process, which is simple and at a low cost.

Figure 2:
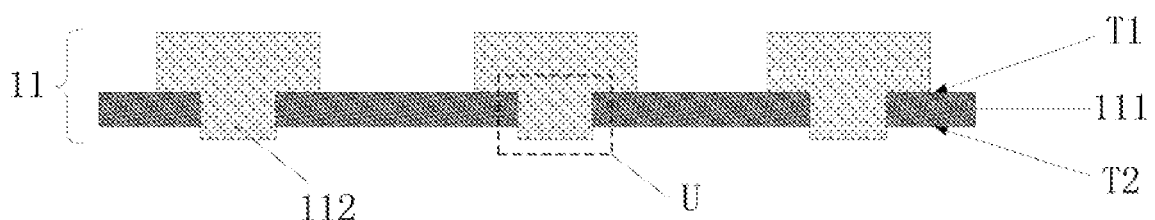
FIG. 2 is a second schematic diagram of a structure of a transfer carrier according to an embodiment of the present disclosure.

In addition, as shown in FIG. 2, in some embodiments, the thermoplastic structures 112 in the transfer carrier 11 may not be set as an integrated structure. In other words, the thermoplastic structures 112 may also be independent of each other, thereby saving materials of the thermoplastic structures 112 and costs. Different from the structure shown in FIG. 1, it is required in the actual manufacturing process to form block-shaped thermoplastic film layers at positions of the via holes U, and then the thermoplastic film layers independent of each other may be heated at the same time, and extruded after being softened, so that part of each of the thermoplastic film layers fills a corresponding one of the via holes U, overflows out of the second surface T2 of the substrate 111 and then is solidified to form a plurality of thermoplastic structures shown in FIG. 2.

In some embodiments, in the transfer carrier provided by an embodiment of the present disclosure, the substrate has a thermal conductivity. Optionally, the heat conductivity coefficient of the substrate is greater than that of the thermoplastic structures. In the manufacturing process of the transfer carrier, the substrate may be directly heated, and the thermoplastic film layers may be indirectly heated using the thermal conductivity of the substrate. Besides, in specific implementation, the substrate may not have a thermal conductivity, and the thermoplastic film layers may be heated by external means, and property of the substrate is not limited herein.

Optionally, in the transfer carrier provided by an embodiment of the present disclosure, the material of the substrate may be a metal or ceramic. A metal or ceramic has a relatively good thermal conductivity. For example, metals such as iron, steel, and alloys may be used. Therefore, it may be ensured that the substrate has a good thermal conductivity by using a metal or ceramic to make the substrate. In addition, other thermally conductive materials may also be used for the substrate, and the material of the substrate is not limited herein.

In practical applications, the transfer carrier provided by an embodiment of the present disclosure may further include: a plurality of heating wires positioned between the first surface of the substrate and the thermoplastic structures, wherein, the plurality of heating wires are uniformly distributed in the area of the substrate excluding the via holes;

the heating wires are provided between the first surface of the substrate and the thermoplastic structures and directly contact with the thermoplastic structures, and the thermoplastic film layers may be directly heated by powering the heating wires during the manufacturing process of the transfer carrier;

and/or the transfer carrier further includes: a plurality of heating wires positioned on the second surface of the substrate, wherein the plurality of heating wires are uniformly distributed in the area of the substrate excluding the via holes.

Since the substrate has a thermal conductivity, the heating wires may also be provided on the second surface of the substrate. During the manufacturing process of the transfer carrier, the heating wires may be powered to transfer heat to the thermoplastic film layers through the substrate.

Figure 3:
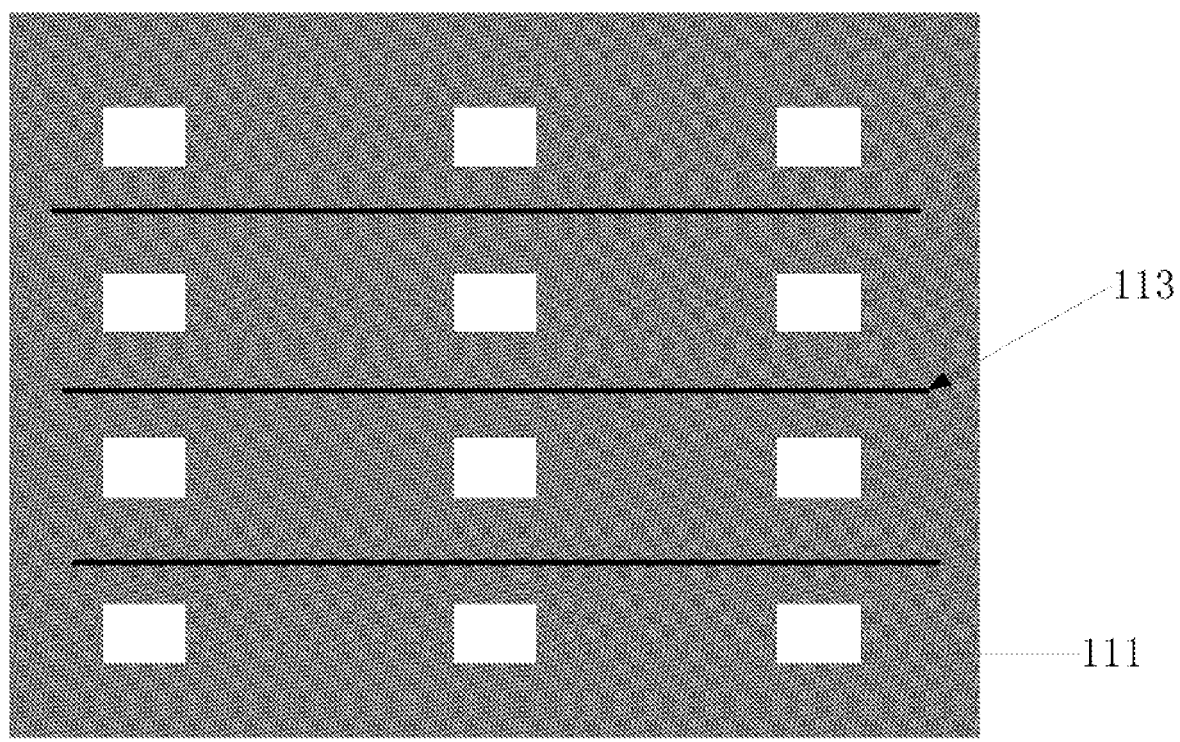
FIG. 3 is a first schematic diagram of a top view of a structure of a transfer carrier according to an embodiment of the present disclosure.
Figure 4:
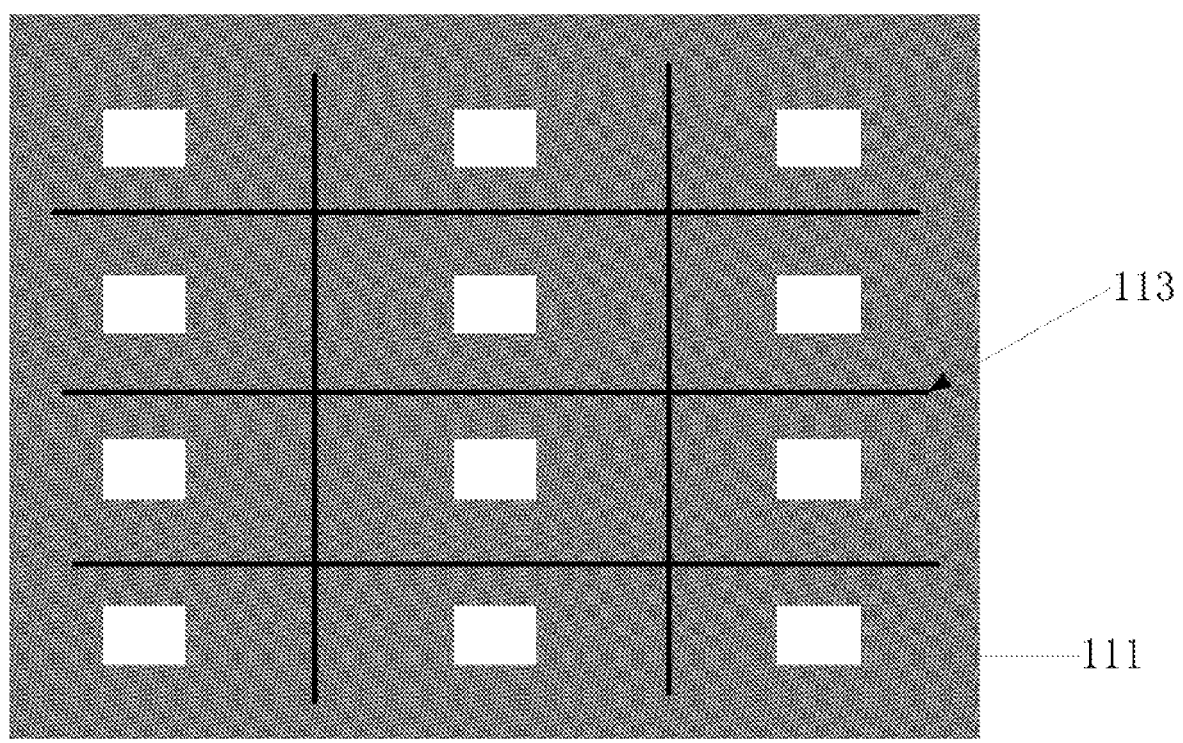
FIG. 4 is a second schematic diagram of a top view of a structure of a transfer carrier according to an embodiment of the present disclosure.

FIGS. 3 and 4 are schematic diagrams of a top view of a structure of a substrate, and surfaces shown in the figures may represent the first surface or the second surface. As shown in FIGS. 3 and 4, heating wires 113 may be uniformly distributed on a surface of the substrate (the first surface or the second surface). As shown in FIG. 3, a plurality of heating wires 113 parallel to each other may be provided, in this figure, it is taken as an example that the heating wires 113 extend in a horizontal direction, and the heating wires 113 may also be set to extend in a vertical direction. As shown in FIG. 4, a plurality of heating wires 113 extending in a horizontal direction and a plurality of heating wires 113 extending in a vertical direction may be provided, and the heating wires 113 on the surface of the substrate 111 form a grid. Furthermore, the heating structures on the surface of the substrate may also be arranged in another mode as long as the heating wires may be uniformly distributed on the surface of the substrate to ensure uniformity of heating of the thermoplastic film layers. The specific modes of arranging the heating wires are not limited herein.

In some embodiments, the heating wires may be provided only on the first surface of the substrate, or only on the second surface of the substrate, or on both the first surface and the second surface of the substrate, which is not limited herein.

In practical applications, in the transfer carrier provided by an embodiment of the present disclosure, the material of the thermoplastic structures is wax, rubber or silica gel. Materials such as wax, rubber or silica gel have a low melting point, and are likely to melt or soften after being heated and solidify after being cooled. Since the extent of thermal expansion and contraction of the materials is relatively great, a negative pressure may be easily formed to absorb the light-emitting diode chips. The thermoplastic structure adopting wax, rubber or silicon is only taken as an example herein, and in specific implementation, the thermoplastic structures may also adopt other materials, which is not limited herein.

According to a second aspect, based on the same inventive concept, an embodiment of the present disclosure further provides a method for transferring a light-emitting diode chip. Since the principle of the method to solve problems is similar to that of the transfer carrier, implementation of the transfer carrier may be referred to for implementation of the method, and the repeated contents are omitted herein.

Figure 5:
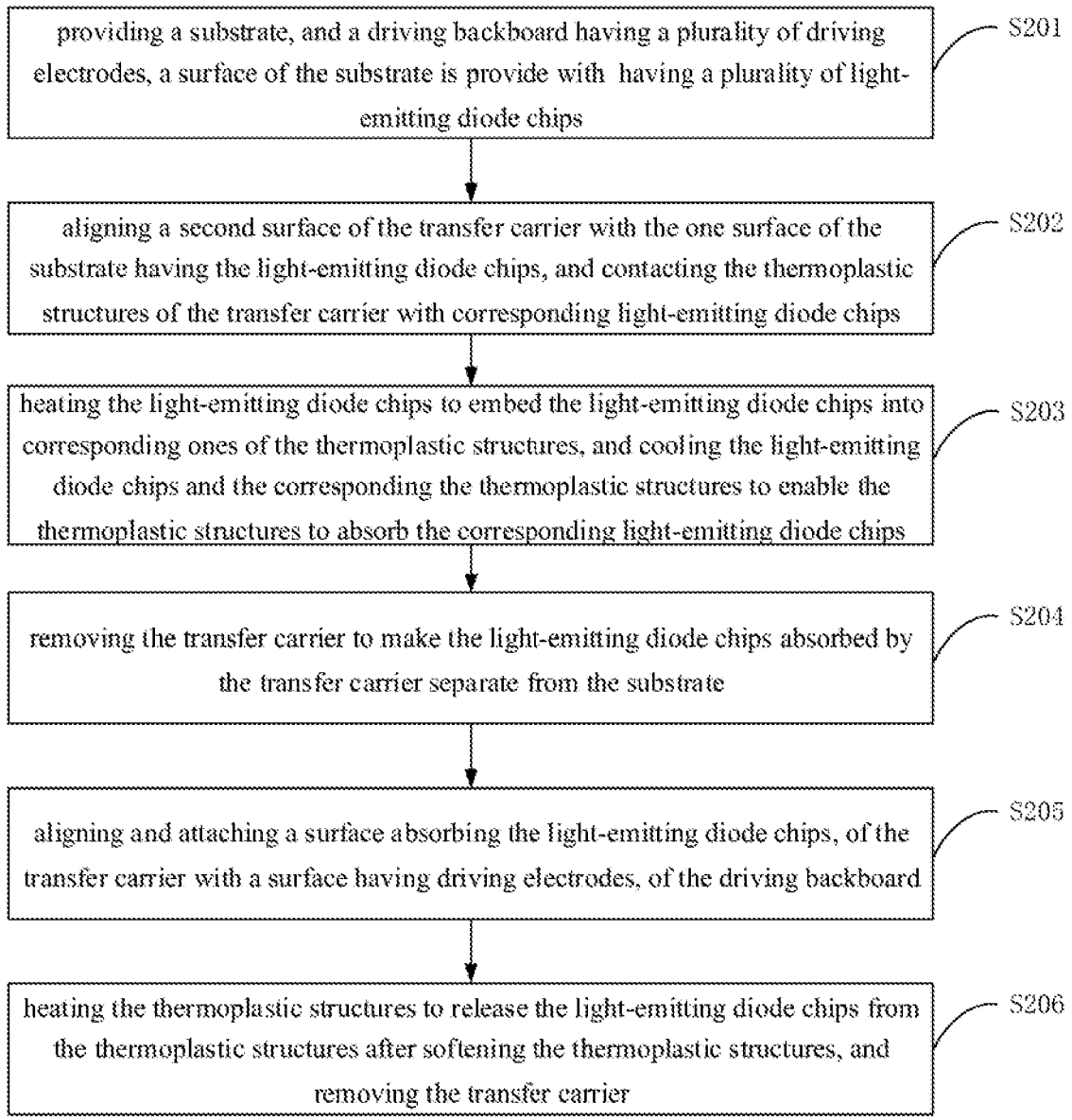
FIG. 5 is a flow chart of a method for transferring a light-emitting diode chip according to an embodiment of the present disclosure.
Figure 6A:
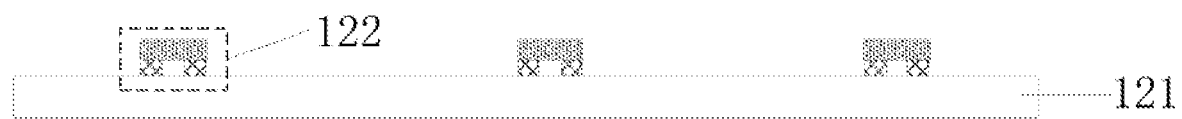
FIG. 6a, FIG. 6b are schematic diagrams of structures corresponding to step S201 of a method for transferring a light-emitting diode chip according to an embodiment of the present disclosure.
Figure 6B:
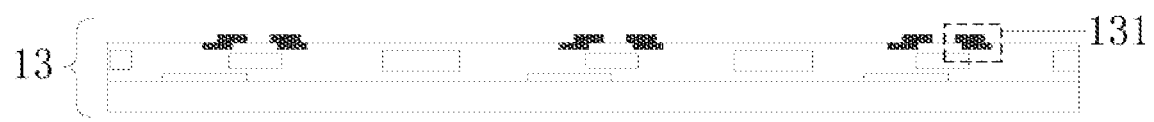

Optionally, the method for transferring a light-emitting diode chip provided by an embodiment of the present disclosure, as shown in FIG. 5, includes:

S201: providing a substrate 121 having a plurality of light-emitting diode chips 122 on one surface, as shown in FIG. 6a, and a driving backboard 13 having a plurality of driving electrodes 131, as shown in FIG. 6b. In the actual process, an epitaxial structure in a light-emitting diode chip needs to be grown and formed on a particular wafer, and after the epitaxial structure is formed, a plurality of light-emitting diode chips formed may be transferred to a substrate to ensure that the light-emitting diode chips can be easily separated from the substrate in subsequent steps.

Figure 6C:
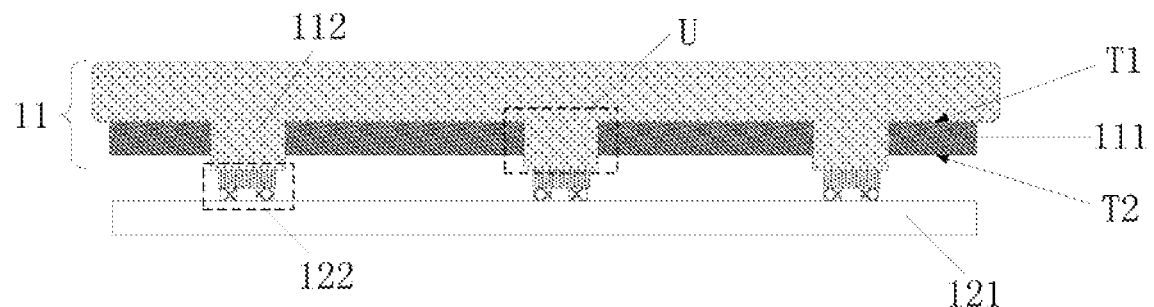
FIG. 6c is schematic diagrams of structures corresponding to step S202 of a method for transferring a light-emitting diode chip according to an embodiment of the present disclosure.

S202: as shown in FIG. 6c, aligning the second surface T2 of the transfer carrier 11 with one surface of the substrate 121 having the light-emitting diode chips 122, and contacting the plurality of thermoplastic structures 112 of the transfer carrier 11 with corresponding ones of the light-emitting diode chips 122.

Figure 6D:
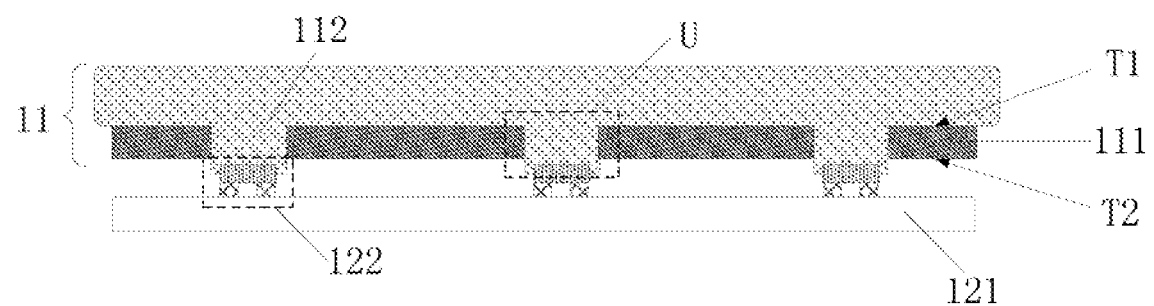
FIG. 6d is schematic diagrams of structures corresponding to step S203 of a method for transferring a light-emitting diode chip according to an embodiment of the present disclosure.

S203: heating the light-emitting diode chips 122 to embed the light-emitting diode chips 122 into corresponding ones of the thermoplastic structures 112, as shown in FIG. 6d, and then cooling the light-emitting diode chips 122 and the corresponding ones of the thermoplastic structures 112 to make the thermoplastic structures 112 absorb the corresponding ones of the light-emitting diode chips 122.

Since the light-emitting diode chips 122 contact with the thermoplastic structures 112, heating the light-emitting diode chips 122 may cause the thermoplastic structures 112 to be heated indirectly, and after the thermoplastic structures 112 are melted or softened after being heated, the light-emitting diode chips 122 may be embedded into the corresponding ones of the thermoplastic structures 112 due to gravity of the thermoplastic structures 112 or by applying a certain pressure, thereafter, heating is stopped to cool the light-emitting diode chips 122 and the thermoplastic structures 112, and a negative pressure may be formed in the space in which the light-emitting diode chips 122 are embedded into the thermoplastic structures 112 due to the effect of thermal expansion and contraction, so that the thermoplastic structures may firmly absorb the light-emitting diode chips 122. Optionally, in the cooling process, the thermoplastic structures 112 at least need to be cooled to a temperature below a melting point or glass transition temperature (Tg). For example, when the thermoplastic structures 112 adopt wax, the temperature may be just reduced to about 80° C. to reach the glass transition temperature.

Figure 6E:
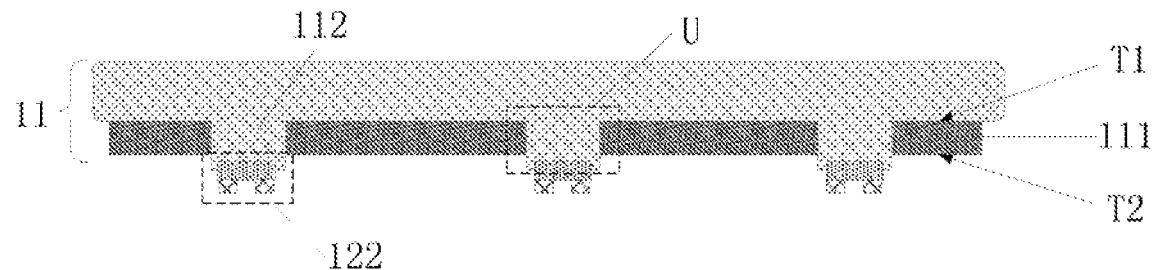
FIG. 6e is schematic diagrams of structures corresponding to step S204 of a method for transferring a light-emitting diode chip according to an embodiment of the present disclosure.

S204: as shown in FIG. 6e, removing the transfer carrier 11 to make the light-emitting diode chips 122 absorbed by the transfer carrier 11 separate from the substrate.

Figure 6F:
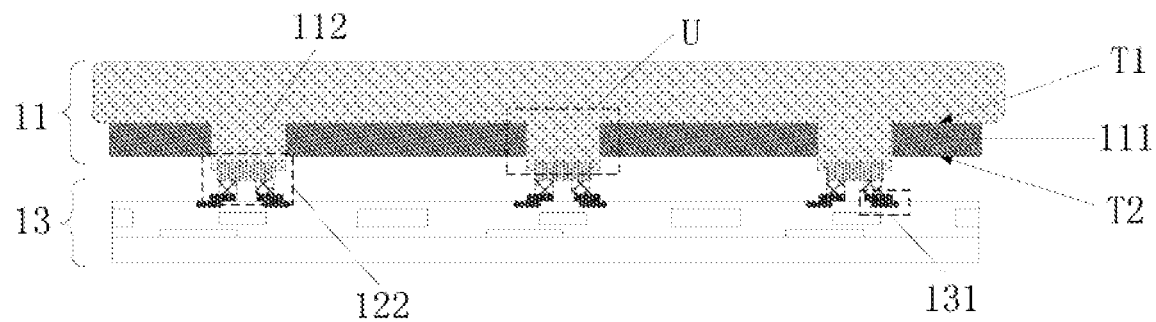
FIG. 6f is schematic diagrams of structures corresponding to step S205 of a method for transferring a light-emitting diode chip according to an embodiment of the present disclosure.

S205: aligning and attaching one surface of the transfer carrier 11 absorbing the light-emitting diode chips 122 with one surface of the driving backboard 13 having driving electrodes 131, as shown in FIG. 6f.

Figure 6G:
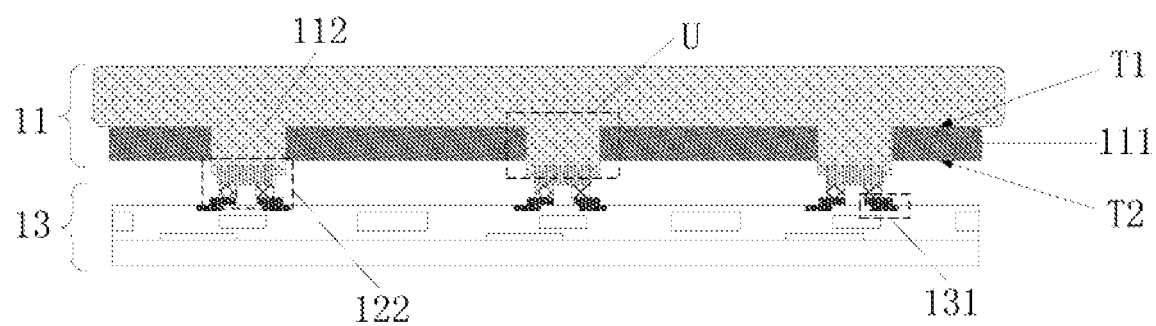
FIG. 6g is schematic diagrams of structures corresponding to step S206 of a method for transferring a light-emitting diode chip according to an embodiment of the present disclosure.

S206: heating the thermoplastic structures 112 to release the light-emitting diode chips 122 after softening the thermoplastic structures 112, thereafter removing the transfer carrier 11 to obtain the structure as shown in FIG. 6g to transfer the light-emitting diode chips 122 to the driving backboard 13. The thermoplastic structures 112 may be melted or softened again by heating the thermoplastic structures 112 so as to reduce a negative pressure between the thermoplastic structures 112 and the corresponding ones of the light-emitting diode chips 122 to enable the light-emitting diode chips 122 to separate from the corresponding ones of the thermoplastic structures 112, and thus the light-emitting diode chips 122 are placed on the driving backboard 13.

In the method provided by an embodiment of the present disclosure, the transfer carrier is used to transfer the light-emitting diode chips, and an embedded adsorption-pickup mechanism is used to realize mass transfer of light-emitting diode chips. During the transfer, only heating and cooling processes are needed to realize absorbing the light-emitting diode chips, and the light-emitting diode chips may be released by reheating. The manufacturing costs are low and transfer efficiency is high on the basis of transferring the light-emitting diode chips at a high precision and a high efficiency.

Optionally, in the method provided by an embodiment of the present disclosure, the S203, heating the light-emitting diode chips to embed the light-emitting diode chips into the corresponding ones of the thermoplastic structures includes:

heating the substrate having a plurality of light-emitting diode chips on the surface.

The light-emitting diode chips may be indirectly heated by heating the substrate. Optionally, the substrate having the light-emitting diode chips may be a blue film, an ultraviolet (UV) film or another substrate such as a glass substrate, a steel plate and the like. The examples herein only serve for illustrative purposes and do not limit materials of the substrate.

Further, in the method provided by an embodiment of the present disclosure, after aligning and attaching the transfer carrier with the driving backboard, the light-emitting diode chips contact with corresponding ones of the driving electrodes through a welding material.

In practical applications, surfaces of the light-emitting diode chips or surfaces of the driving electrodes may be coated with the welding material prior to S205, and after S205, the light-emitting diode chips may contact with the corresponding ones of the driving electrodes through the welding material. Optionally, the welding material may be thermosetting or ultraviolet curing conductive adhesives such as a solder paste, a silver colloid, a copper colloid, or a super absorbent resin (self-alignment paste, SAP), and these examples only serve for illustrative purposes. In specific implementation, other welding materials may also be used, which is not limited herein.

In S206, heating the thermoplastic structures to release the light-emitting diode chips after softening the thermoplastic structures includes:

heating the driving backboard to fix the light-emitting diode chips and the corresponding ones of the driving electrodes, and meanwhile, releasing the light-emitting diode chips after softening the thermoplastic structures.

By heating the driving backboard, the light-emitting diode chips, the welding material, and the thermoplastic structures may be indirectly heated. After the welding material is heated, the light-emitting diode chips and the corresponding ones of the driving electrodes may be bonded, so that the light-emitting diode chips are fixed to the driving electrodes. Meanwhile, the thermoplastic structures are softened after being heated and then release the light-emitting diode chips, so that after the transfer carrier is subsequently removed, the light-emitting diode chips may be separated from the transfer carrier, thereby realizing transfer of the light-emitting diode chips.

It should be noted that in the heating processes in the embodiments of the present disclosure, it is only required to melt or soften the thermoplastic material or melt the welding material, and other structures of the transfer carrier, the substrate having light-emitting diode chips, and the driving backboard will not be damaged. A reasonable heating temperature may be set according to properties of the thermoplastic material or welding material, which is not limited herein.

In addition, in some embodiments as shown in FIG. 6a to FIG. 6g, the transfer carrier shown in FIG. 1 is taken as an example for illustrative purpose, the structure as shown in FIG. 2 may also be used for transfer, which is not limited herein. Moreover, the structure where extraction electrodes are positioned on the same side of light-emitting diode chips is taken as an example for illustrative purpose, but in some embodiments, the method may also transfer a structure where extraction electrodes are positioned on different sides of light-emitting diode chips, which is not limited herein.

According to a third aspect, based on the same inventive concept, an embodiment of the present disclosure further provides a manufacturing method of a transfer carrier. Since the principle of the manufacturing method to solve problems is similar to that of the transfer carrier, implementation of the transfer carrier may be referred to for implementation of the manufacturing method, and the repeated contents are omitted herein.

Figure 7:
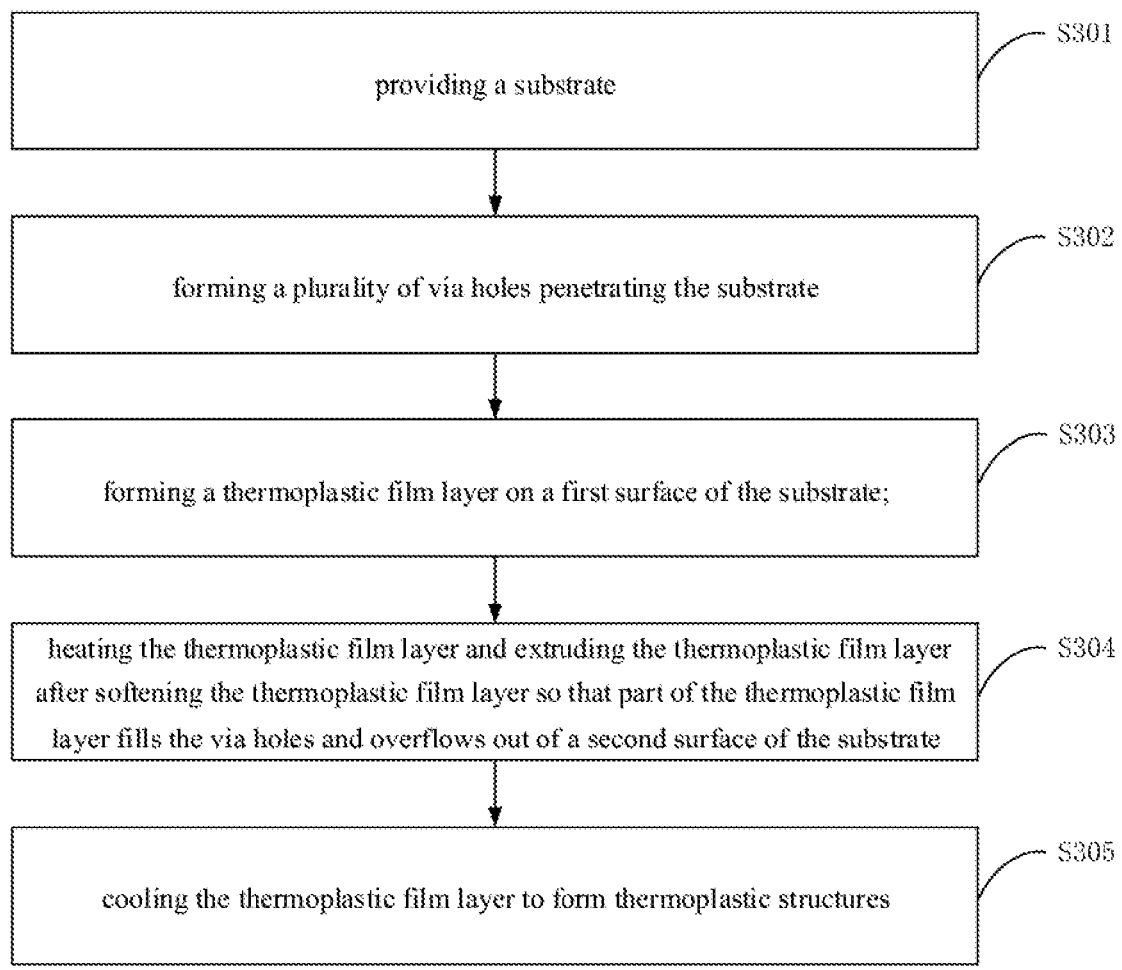
FIG. 7 is a flow chart of a method for manufacturing a transfer carrier according to an embodiment of the present disclosure.
Figure 8A:
FIG. 8a is schematic diagrams of structures corresponding to step S301 of a manufacturing method of a transfer carrier according to an embodiment of the present disclosure.
Figure 8B:
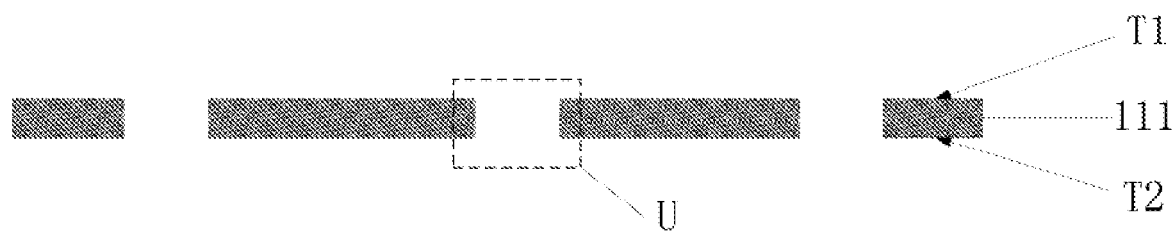
FIG. 8b is schematic diagrams of structures corresponding to step S302 of a manufacturing method of a transfer carrier according to an embodiment of the present disclosure.
Figure 8C:
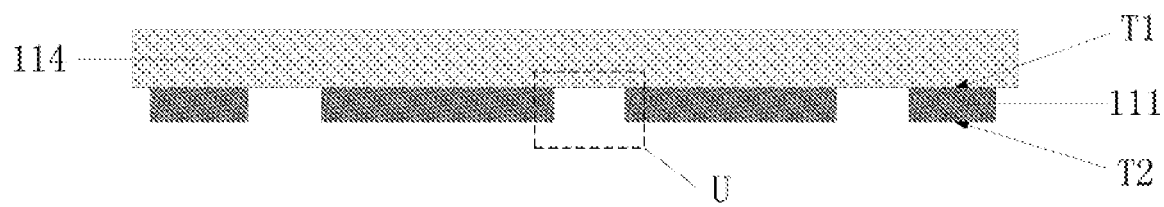
FIG. 8c is schematic diagrams of structures corresponding to step S303 of a manufacturing method of a transfer carrier according to an embodiment of the present disclosure.
Figure 8D:
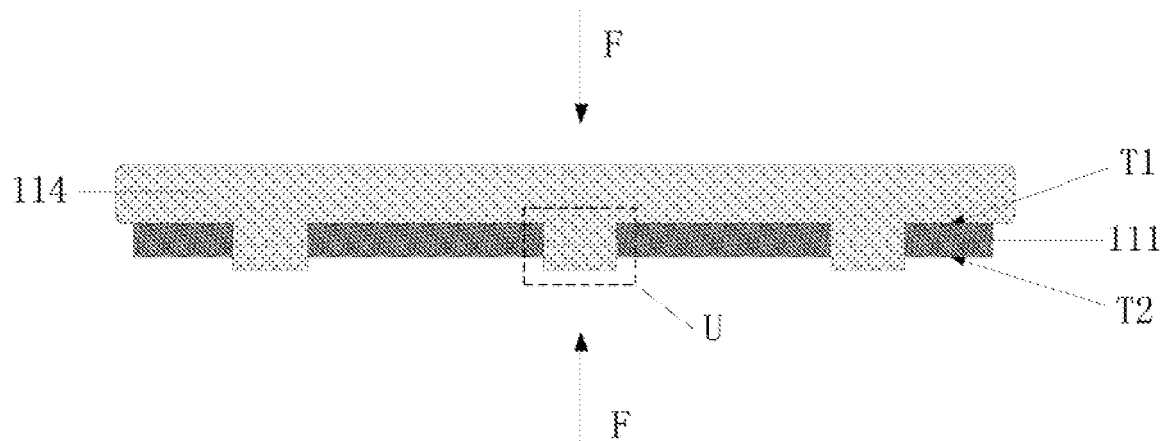
FIG. 8d is schematic diagrams of structures corresponding to step S304 of a manufacturing method of a transfer carrier according to an embodiment of the present disclosure.

Optionally, the manufacturing method of the transfer carrier provided by an embodiment of the present disclosure, as shown in FIG. 7, includes:

S301: providing a substrate 111, as shown in FIG. 8a. Optionally, the substrate 111 may be a substrate with a uniform thickness and a flat surface. For example, a metal sheet or a ceramic sheet having a thermal conductivity may be used;

S302: forming a plurality of via holes U penetrating the substrate 111, as shown in FIG. 8b. Optionally, the substrate 111 may be perforated by laser drilling, photoetching, or electroforming to form a plurality of via holes U having predetermined spacing and an appropriate size;

S303: forming a thermoplastic film layer 114 on a first surface T1 of the substrate 111, as shown in FIG. 8c. The thermoplastic film layer 114 may adopt materials such as wax, rubber, or silica gel. Optionally, the thermoplastic film layer 114 may be disposed on the substrate 111, as shown in the structure in FIG. 8c, or the substrate 111 may be disposed on the thermoplastic film layer 114, which is not limited herein;

S304: heating the thermoplastic film layer 114. For example, the thermoplastic film layer 114 may be heated by heating wires on the surface of the substrate, and after being softened, the thermoplastic film layer 114 is extruded, as shown in FIG. 8d, the thermoplastic film layer 114 and the substrate 111 are pressed against each other by a pressure F, so that part of the thermoplastic film layer 114 fills the via holes U and overflows out of the second surface T2 of the substrate 111, as shown in FIG. 8d. In some embodiments, a pressure may be applied to one side of the thermoplastic film layer 114 far away from the substrate 111, a pressure may be applied to one side of the substrate 111 far away from the thermoplastic film layer 114, or a pressure may be applied to both sides, so that the thermoplastic film layer 114 overflows out of the second surface T2 of the substrate 111 after being extruded. In addition, since the thermoplastic film layer 114 has been softened, the thermoplastic film layer 114 may be extruded from the via holes U just by applying a small pressure;

S305: cooling the thermoplastic film layer 114 to form thermoplastic structures 112 so as to obtain the structure shown in FIG. 1. Optionally, the thermoplastic film layer 114 may be cooled by stopping heating, and during the cooling process, the substrate 111 at least needs to be cooled to a temperature below a melting point or glass transition temperature (Tg) of a thermoplastic material.

In embodiments of the present disclosure, the transfer carrier may be obtained just by a substrate and a thermoplastic material, so that material costs of the transfer carrier are low. Besides, a thermoplastic film layer is extruded from via holes by using a substrate with a plurality of via holes, so that a transfer carrier can be obtained economically and quickly with a simple manufacturing process at a low process cost, thereby achieving easily a size enlargement and a mass production.

The transfer carrier and the manufacturing method thereof, and the method for transferring a light-emitting diode chip provided by embodiments of the present disclosure can realize transfer of the light-emitting diode chips just by providing a plurality of via holes penetrating through the substrate and a plurality of thermoplastic structures. The transfer carrier has a simple structure and size enlargement can be easily realized, and besides, material costs are low.

During transfer process of the light-emitting diode chips, the heated light-emitting diode chips can be embedded into the thermoplastic structures, and after being cooled, the thermoplastic structures are enabled to absorb the light-emitting diode chips, so that mass transfer of the light-emitting diode chips can be realized and the light-emitting diode chips can be selectively picked up. The transfer process can be conducted easily at a low cost with a high transfer efficiency.

It is apparent that various variations and modifications may be made to the present disclosure by those skilled in the art, without departing from the spirit and scope of the present disclosure. Therefore, the variations and modifications to the present disclosure within the scope of the claims of the present disclosure and their equivalents are to be construed as being included in the disclosure of the present disclosure.

What is claimed is:

1. A transfer carrier, comprising:
   a substrate having a plurality of via holes penetrating the substrate in a thickness direction of the substrate, the substrate having a first surface and a second surface, wherein the first surface and the second surface are opposite to each other;
   a plurality of thermoplastic structures configured to fill the via holes, wherein one end of the thermoplastic structures protrudes from the second surface, and the other end of the thermoplastic structures covers a surrounding area on the first surface, of corresponding via holes; and
   a plurality of heating wires between the first surface of the substrate and the thermoplastic structures;
   wherein the heating wires are uniformly distributed in an area of the substrate excluding the via holes.

2. The transfer carrier according to claim 1, wherein parts of the thermoplastic structures are connected to each other as an integrated structure, wherein the parts cover the first surface.

3. The transfer carrier according to claim 1, wherein a heat conductivity coefficient of the substrate is greater than a heat conductivity coefficient of the thermoplastic structures.

4. The transfer carrier according to claim 3, wherein a material of the substrate is metal or ceramic.

5. The transfer carrier according to claim 1, further comprising a plurality of heating wires on the second surface of the substrate, wherein,
   the heating wires are uniformly distributed in an area of the substrate excluding the via holes.

6. The transfer carrier according to claim 1, wherein a material of the thermoplastic structures is wax, rubber, or silica gel.

7. The transfer carrier according to claim 1, further comprising a plurality of light-emitting diode chips, wherein the light-emitting diode chips correspond to the thermoplastic structures in an one-to-one manner, and are embedded in corresponding thermoplastic structures respectively.

8. A manufacturing method of the transfer carrier according to claim 1, comprising:
   providing a substrate;
   forming a plurality of via holes penetrating the substrate;
   forming a thermoplastic film layer on a first surface of the substrate;
   heating the thermoplastic film layer and extruding the thermoplastic film layer after softening the thermoplastic film layer to make parts of the thermoplastic film layer fill the via holes and overflow out of a second surface of the substrate; and
   cooling the thermoplastic film layer to form thermoplastic structures.

9. The manufacturing method according to claim 8, wherein the extruding the thermoplastic film layer comprises:
   applying a pressure to a side far away from the substrate, of the thermoplastic film layer, or applying a pressure to a side far away from the thermoplastic film layer, of the substrate.

10. The manufacturing method according to claim 8, wherein the extruding the thermoplastic film layer comprises:
    applying a pressure to a side far away from the substrate, of the thermoplastic film layer, a side far away from the thermoplastic film layer, of the substrate.

* * * * *